(12) United States Patent
Go et al.

(10) Patent No.: US 6,282,351 B1
(45) Date of Patent: Aug. 28, 2001

(54) OPTICAL MODULE AND A METHOD OF FABRICATING THE SAME

(75) Inventors: Hisao Go; Shunichi Yoneyama, both of Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/252,785

(22) Filed: Feb. 19, 1999

(30) Foreign Application Priority Data

Feb. 20, 1998 (JP) .................................................. 10-038749
Mar. 16, 1998 (JP) .................................................. 10-065616

(51) Int. Cl.⁷ ...................................................... G02B 6/42
(52) U.S. Cl. ............................................. 385/92; 385/137
(58) Field of Search .................................. 385/88–94, 31, 385/32, 137

(56) References Cited

U.S. PATENT DOCUMENTS

| 4,479,698 | * | 10/1984 | Landis et al. ........................... 385/91 |
| 4,810,557 | | 3/1989 | Blonder ................................. 428/156 |
| 4,964,694 | * | 10/1990 | Oohashi et al. ...................... 385/128 |
| 5,165,002 | * | 11/1992 | Cumberledge et al. ............... 385/92 |
| 5,617,495 | | 4/1997 | Funabashi et al. ..................... 385/92 |
| 5,748,822 | * | 5/1998 | Miura et al. ........................... 385/90 |
| 5,793,914 | | 8/1998 | Sasaki ................................... 385/49 |

FOREIGN PATENT DOCUMENTS

| 57-076509 | 5/1982 | (JP) . |
| 63-086409 | 10/1989 | (JP) . |
| 09-152527 | 6/1997 | (JP) . |

* cited by examiner

Primary Examiner—John D. Lee
Assistant Examiner—Michelle R. Connelly-Cushwa
(74) Attorney, Agent, or Firm—McDermott, Will & Emery

(57) ABSTRACT

An optical module which can reduce its size, and a method of making the same are provided. The optical module has a substrate, a carbon-coated optical fiber, a ferrule, and an optical device. The substrate has first, second, and third regions along an axis, and also has a ferrule support groove in the first region, an optical fiber support groove in the second region, and a device mount portion in the third region. The carbon-coated optical fiber is mounted in the optical fiber support groove. The ferrule covers the side face of the optical fiber and is secured to the ferrule support groove. The optical device is mounted at the device mount portion and is optically coupled to the carbon-coated optical fiber.

15 Claims, 16 Drawing Sheets

OPTICAL MODULE AND A METHOD OF FABRICATING THE SAME

BACKGROUND OF THE INVENTION

1. Field of the Invention

The present invention relates to an optical module comprising an optical fiber whose cladding surface is coated with carbon, and a method of making the optical module.

2. Related Background Art

Employed in optical modules is a bared optical fiber stripped of a resin coated on the side face thereof, so that the cladding surface is exposed. The bared optical fiber is used in the optical module, while the bared optical fiber is inserted in a ferrule. The ferrule and the optical fiber whose side face is covered with the ferrule are mounted to an optical module substrate.

SUMMARY OF THE INVENTION

Having studied the prior art, the inventor has found the following problems.

When the bared optical fiber is mounted on the optical module substrate, the bared optical fiber is bent within a permissible range of radius of curvature so that no excess bending stress is applied thereto. Since the bared optical fiber is bent within a predetermined range of radius of curvature, the part of bared optical fiber not covered with the ferrule cannot be shortened. Therefore, it has been impossible for the optical module substrate mounted with the bared optical fiber to reduce its size. The size of the optical module substrate has been one factor preventing the optical module from reducing its dimensions.

It is thus an object of the present invention to provide an optical module that can reduce the dimensions thereof, and a method of making the optical module.

The optical module in accordance with the present invention comprises an optical module substrate, a carbon-coated optical fiber, a ferrule, and an optical device. The carbon-coated optical fiber has the outer periphery of its cladding coated with carbon. The coating thickness of carbon is within the range of 0.03 $\mu$m to 0.05 $\mu$m, for example. The optical module substrate has first, second, and third regions along a predetermined axis. This substrate is provided with a ferrule support groove in the first region, an optical fiber support groove in the second region, and a device mount portion in the third region. The carbon-coated optical fiber is mounted on the optical fiber support groove. The side face of the carbon-coated optical fiber is covered with the ferrule. The ferrule is mounted on the ferrule support groove. In the device mount portion, the optical device is placed so as to be optically coupled with the optical fiber.

When the carbon-coated optical fiber is employed as the optical fiber placed on the optical module substrate, then the radius of curvature permitted to the optical fiber in the placement can be lowered. As a result, the part of optical fiber not covered with the ferrule can reduce its length, whereby the optical fiber support groove can be shortened. Hence, the optical module substrate would attain a smaller size.

The ferrule support groove supports the ferrule by two faces thereof, whereas the optical fiber support groove supports the carbon-coated optical fiber by two faces thereof. The device mount portion includes a position marker for determining the position at which the optical device is to be mounted.

The optical module substrate can comprise the ferrule support groove and the optical fiber support groove on the same surface of the optical module substrate. In this case, the optical module substrate is preferably formed from a silicon substrate.

The optical module substrate can have a connection groove formed so as to separate the first region and the second region from each other. The connection groove can have a portion deeper than the ferrule support groove.

The optical module substrate can have a positioning groove formed so as to separate the second region and the third region from each other.

The optical module substrate can have a base having the ferrule support groove and a platform having the optical fiber support groove and the device mount portion. The platform is mounted on the base.

The method of making an optical module comprises the steps of: preparing a substrate having first, second, and third regions placed along a predetermined axis; mounting an optical device on a device mount portion of the substrate; placing a carbon-coated optical fiber in an optical fiber support groove, said carbon-coated optical fiber being inserted and secured to a ferrule; securing an end portion of the carbon-coated optical fiber placed in the optical fiber support groove to the substrate; and placing the ferrule with the carbon-coated optical fiber inserted therein in a ferrule support groove.

If the carbon-coated optical fiber is used, the carbon-coated optical fiber can be bent with a curvature smaller than that permitted in the conventional bared optical fiber when the carbon-coated optical fiber is placed in the optical fiber support groove while bending. The part of the carbon-coated optical fiber extending from the ferrule can be placed in the short optical fiber support groove of the small-sized substrate.

The method of making an optical module can comprise a step of forming the ferrule support groove in the first region, the optical fiber support groove in the second region, and a marker for mounting the optical device in the third region.

This step of forming can have a step of collectively forming the ferrule support groove, optical fiber support groove, and marker along a predetermined axis. The ferrule support groove supports the ferrule by two faces thereof, whereas the optical fiber support groove supports the carbon-coated optical fiber by two faces thereof.

Also, the method can have a step of forming a connection groove that separates the first region and the second region from each other and intersects the predetermined axis.

Further, the method can have a step of forming a positioning groove that separates the second region and the third region from each other and extends in a direction intersecting the predetermined axis. The positioning groove can be used to define the position of an end portion of the carbon-coated optical fiber.

The step of securing has a step of providing a UV curing resin between the substrate and a securing member which is ultraviolet(UV)-transparent, and a step of irradiating the UV-curing resin with ultraviolet ray so as to cure the UV-curing resin. Using the UV-transparent securing member and the UV-curing resin makes it easier to position the optical fiber with respect to the substrate and secure the optical fiber to the substrate.

DESCRIPTION OF THE PREFERRED EMBODIMENTS

Embodiments of the present invention will be explained with reference to the accompanying drawings. Parts identical or equivalent to each other will be referred to with identical numerals or letters if possible, without repeating their overlapping descriptions. In the following explanation, an optical fiber means a carbon-coated optical fiber unless otherwise specified in particular.

Figure 1:
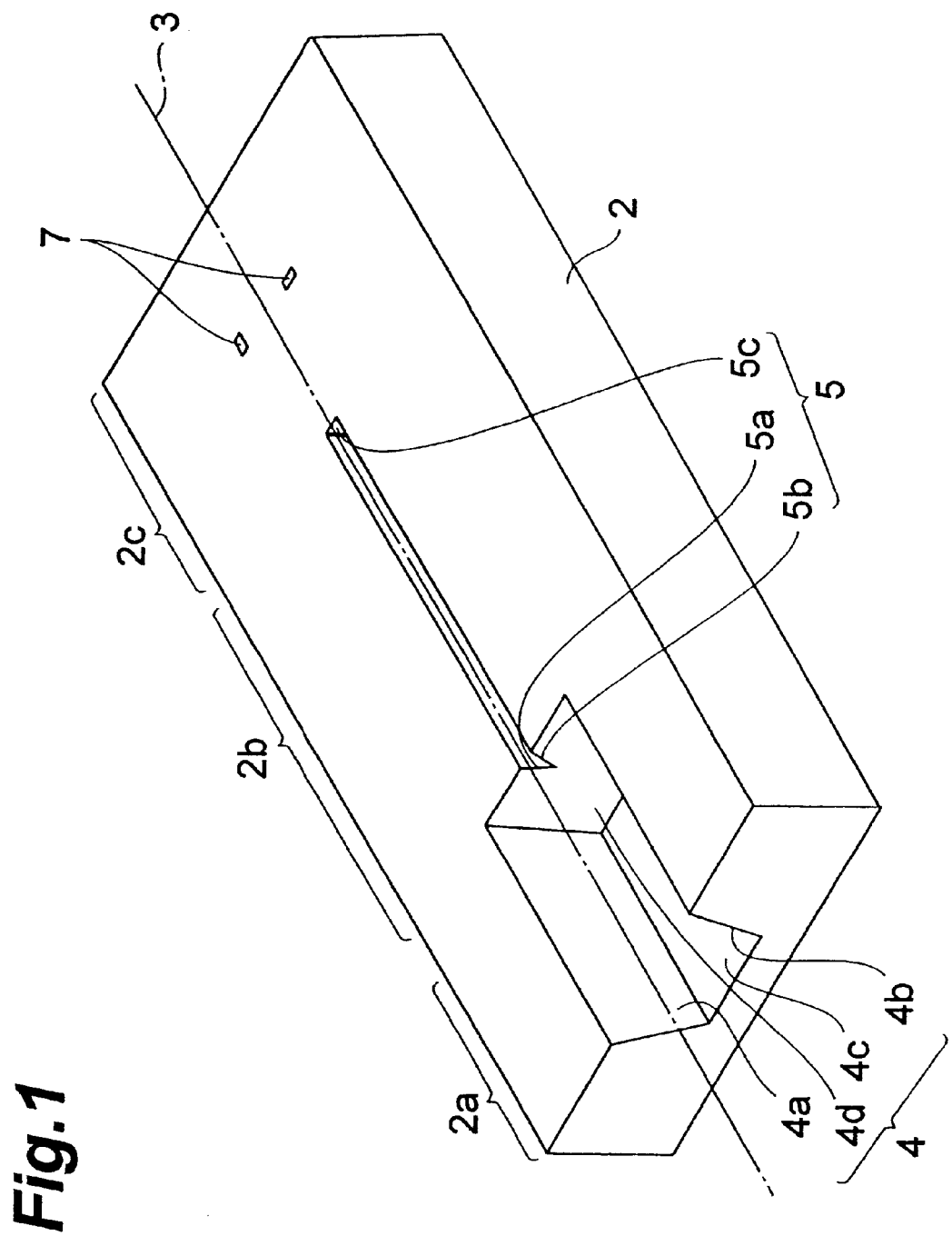
FIG. 1 shows an optical module substrate on which grooves are formed.

FIG. 1 shows an optical module substrate. Referring to FIG. 1, a first region 2a, a second region 2b, and a third region 2c are located on a substrate 2 along a predetermined axis 3.

The first region 2a is provided with a ferrule support groove 4 for supporting a ferrule. The ferrule support groove 4 has two side faces 4a, 4b for supporting the ferrule, and a bottom face 4c held between these two side faces. This groove has a trapezoidal cross section.

The second region 2b is provided with an optical fiber support groove 5 for supporting an optical fiber. The optical fiber support groove 5 has two side faces 5a, 5b for supporting the optical fiber. This groove has a V-shaped cross section.

The ferrule support groove 4 has a tapered surface 4d at the boundary between the ferrule support groove 4 and the optical fiber support groove 5. The optical fiber support 5 has a tapered surface 5c at one end thereof.

The third region 2c has markers 7 for determining the position at which an optical device is disposed.

For example, the ferrule support groove 4, the optical fiber support groove 5, and the markers 7 are formed together as follows. A mask pattern is formed on the surface of the substrate 2 by a photolithography method. A silicon substrate is preferably used as the material for the substrate 2. Employed as the surface orientation of the main surface of the silicon substrate is (100) surface, whereas a KOH solution is used as an etchant. Since the etching rate varies depending on the surface orientation of silicon, it is possible to use a property that (111) surfaces with a slow etching rate appear. By adjusting the etching time and the mask pattern width depending on respective grooves to be formed, the grooves 4, 5 can have a V-shaped or trapezoidal cross section as in the embodiment shown in FIG. 1. The two side faces (surfaces equivalent to the (111) surface of silicon) constituting each of the grooves 4, 5 form obtuse angles with their corresponding surface 2a, 2b of the substrate 2.

In the optical module substrate 2, the optical fiber support groove 5 and the ferrule support groove 4 are formed on the same substrate 2.

Figure 2:
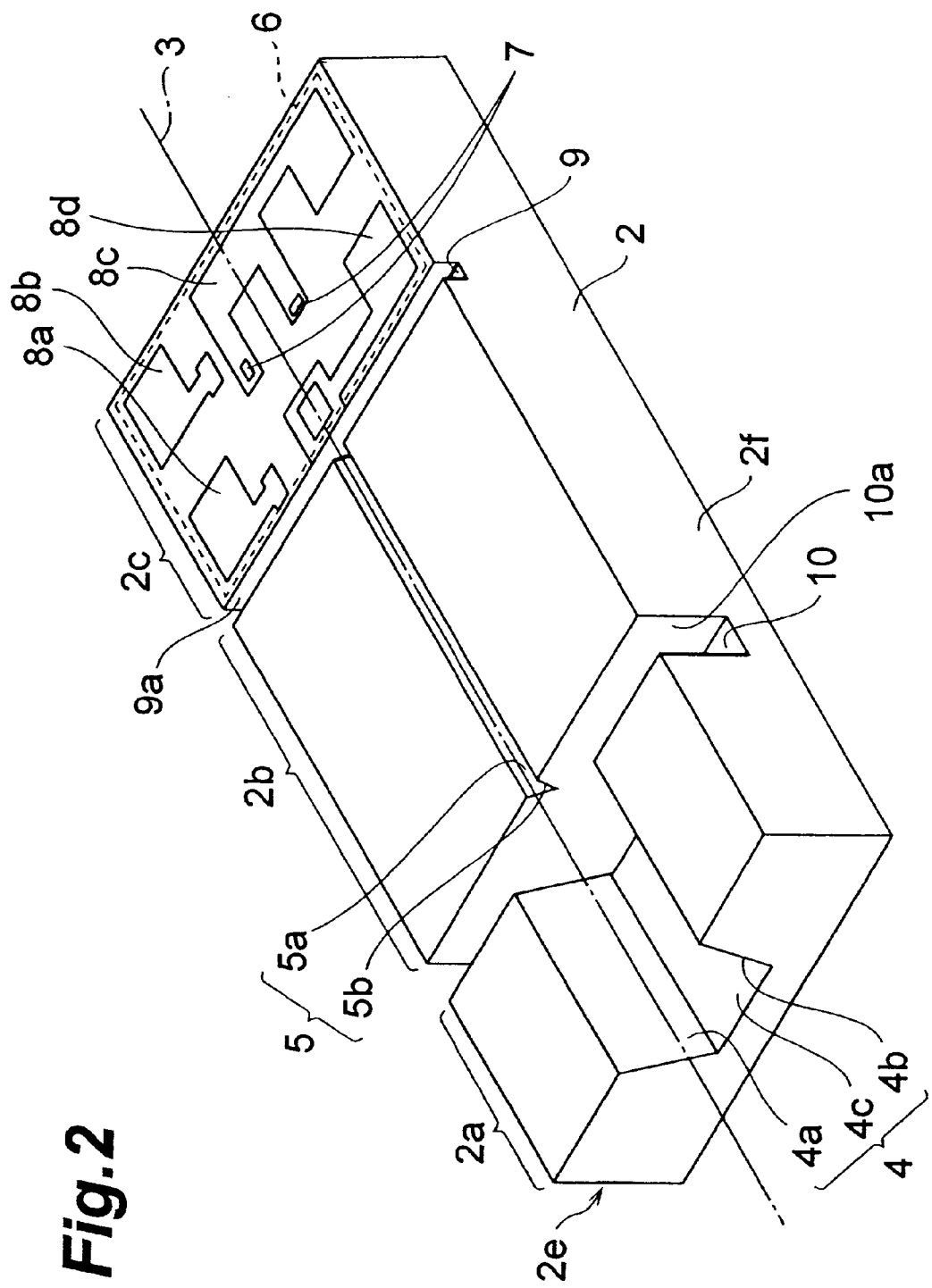
FIG. 2 shows the optical module substrate.

Referring to FIG. 2, the substrate 2 is formed with a positioning groove 9 and a connection groove 10.

The substrate 2 has the positioning groove 9, formed so as to separate the second region 2b and the third region 2c from each other, for positioning the optical fiber. The positioning groove 9 is located at one end portion of the optical fiber support groove 5 and intersects the optical fiber support groove 5 at a predetermined angle, e.g., 90°. The positioning groove 9 is a rectangular groove, deeper than the optical fiber support groove, having a side face 9a. The positioning groove 9 can be formed, for example, by dicing.

The substrate 2 has the connection groove 10 formed so as to separate the first region 2a and the second region 2b from each other. The connection groove 10 is located between the optical fiber support groove 4 and the ferrule support groove 5. The connection groove 10 intersects the optical fiber support groove 4 and the ferrule support groove at an angle such as 90°. The connection groove 10 can be formed across the substrate 2 from one of a pair of opposed side faces 2e, 2f to the other, for example, by dicing. The connection groove 10 is a rectangular groove, deeper than the ferrule support groove 5, having a side face 10a.

When the optical fiber support groove 5 and the ferrule support groove 4 are formed by etching, a tapered surface (4d in FIG. 1) is formed at the boundary between the optical fiber support groove 5 and the ferrule support groove 4. The connection groove 10 is formed so as to eliminate this tapered surface. As a result, the ferrule disposed in the ferrule support groove 4 can approach the optical fiber support groove 5. The optical fiber support groove 5 has a tapered surface (5c in FIG. 1) at an end portion thereof. The positioning groove 9 is formed so as to eliminate this tapered surface.

The third region 2c has an optical device mount portion 6. The drawings show the substrate 2 preferable for optically coupling a semiconductor light-emitting device (11 in FIG. 3) to the optical fiber. A semiconductor light-emitting device such as semiconductor laser is mounted on the optical device mount portion 6. For monitoring the light-emitting state of the semiconductor laser, a monitor light-receiving device (12 in FIG. 3) such as photodiode can be provided. The optical device mount portion 6 has electrodes 8a, 8b, 8c, 8d for the optical device.

The substrate 2 formed from a silicon substrate is also referred to as silicon bench.

Figure 3:
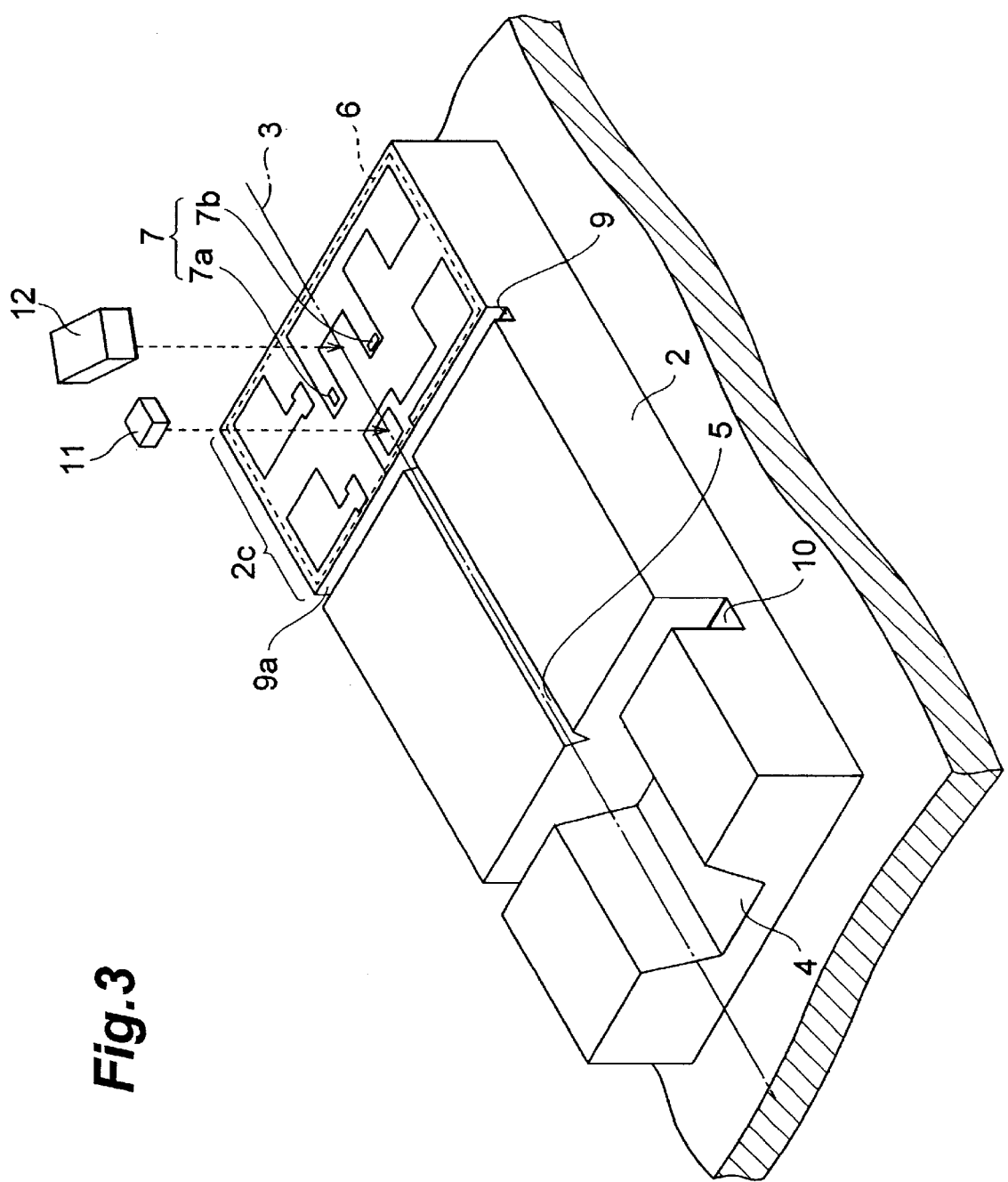
FIG. 3 shows the substrate in a step of mounting an optical device onto the substrate.

FIG. 3 shows a manufacturing step in which the optical device is mounted onto the substrate 2. Referring to FIG. 3, the optical device is arranged on the optical device mount portion 6 of the substrate 2. The optical device is optically coupled with the optical fiber. Such an optical device can be a semiconductor light-emitting device or a semiconductor light-receiving device. The following explanation relates to a semiconductor laser (LD) 11 and a monitor photodiode (PD) 12 mounted on the substrate as the semiconductor light-emitting device and the semiconductor light-receiving device, respectively.

The LD 11 is die-bonded to the optical device mount portion 6 of the substrate 2. The die bonding is carried out after a marker on the LD and the markers on the substrate 2 are aligned with respect to each other by use of image recognition. For achieving reliable optical coupling with the optical fiber (single-mode optical fiber: SMF) disposed in the optical fiber support groove 4, a positioning accuracy of 2 μm or shorter is required.

Subsequently, the PD 12 is die-bonded onto the optical device mount portion 6 of the substrate 2. The die bonding is carried out after a marker on the PD and the markers 7a, 7b on the substrate 2 are aligned with respect to each other by use of image recognition. The positioning accuracy required for this step is within about 10 μm.

Figure 4:
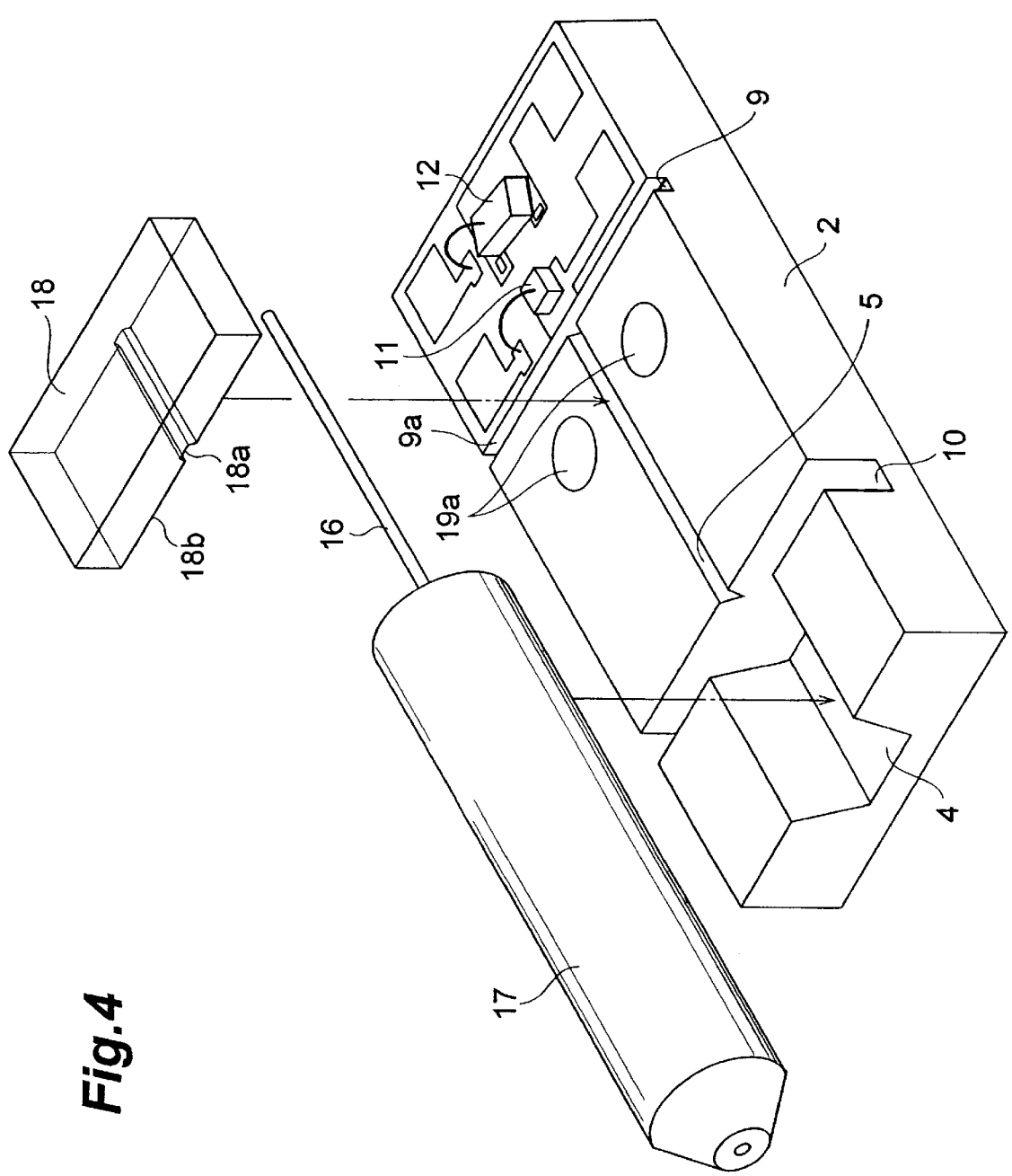
FIG. 4 shows a step of securing an optical fiber to the substrate.

FIG. 4 shows a step of securing an optical fiber to the substrate 2. An optical fiber 16 inserted in a ferrule 17 and a securing member 18 are prepared. In this step, the optical fiber 16 is provided in the optical fiber support groove 5 of the substrate 2 and is secured thereto by means of the securing member 18. For this purpose, a UV-curing resin is dropped on the second region of the substrate 2 so as to avoid the V-shaped groove for the optical fiber, whereby resin members 19a are formed. The optical fiber 16 is placed in the optical fiber support groove 5 and is covered with the securing member 18. The securing member 18 has a groove 18a for accommodating the optical fiber 16 and a bonding surface 18b facing the substrate 2. As a result, the thickness of the resin members 19a between the securing member 18 and the substrate 2 can be reduced. If temperature or humidity fluctuates, the resin members 19a will expand or contract. When the securing member 18 is provided with this structure, however, the strength for securing the optical fiber 16 can be maintained. In this case, the optical fiber 16 is supported by the three flat surfaces including the two side faces of the optical fiber support groove 5 and the bottom face of the groove 18a of the securing member 18. The securing member 18 is formed from UV transparent material, e.g., quartz.

Figure 5:
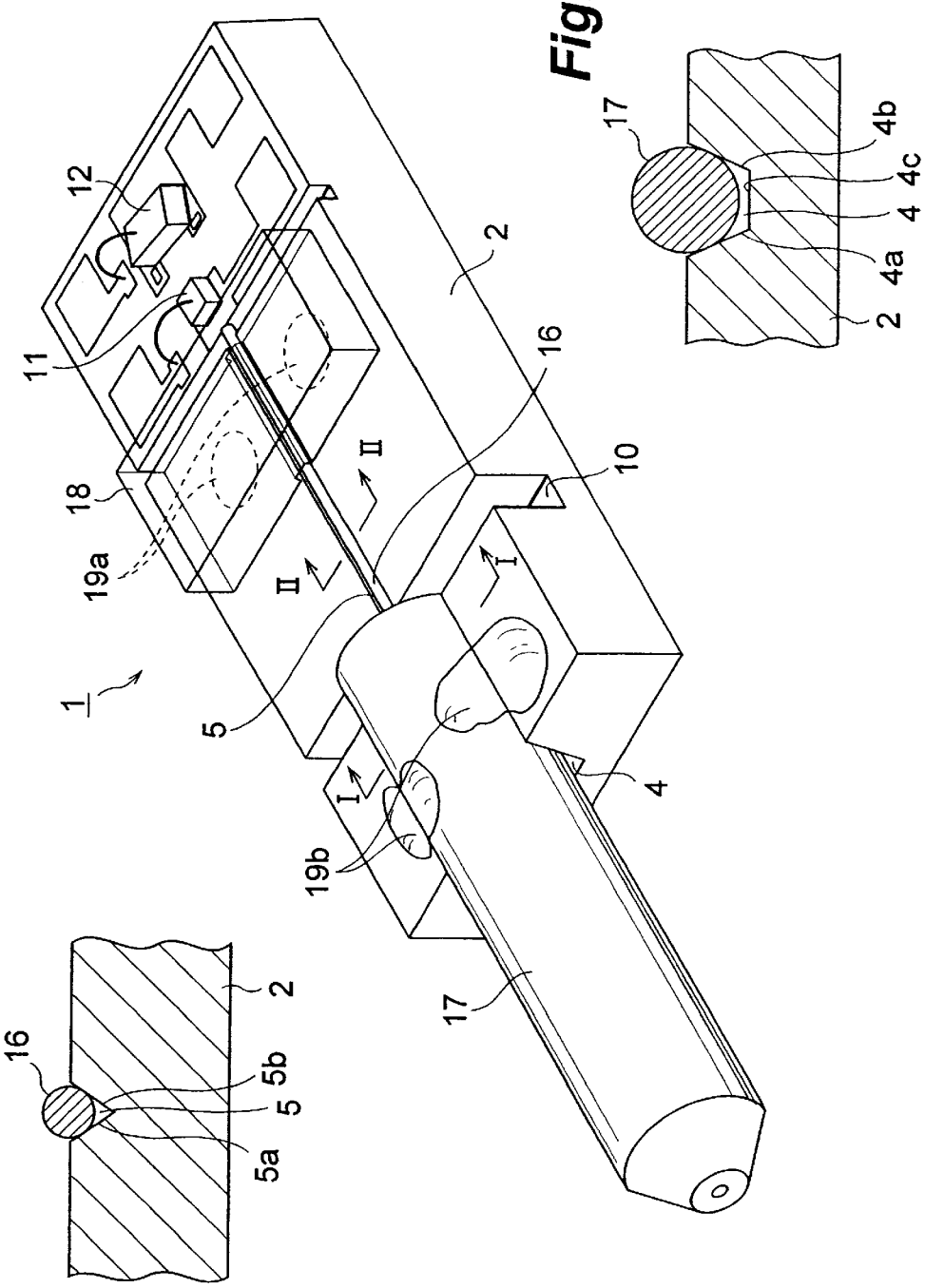
FIG. 5A shows a step of securing a ferrule.
FIG. 5B shows the optical fiber secured to an optical fiber support groove.
FIG. 5C shows a ferrule secured to a ferrule support groove.

FIG. 5A shows a step of securing the ferrule 17. The ferrule 17 with the optical fiber 16 inserted therein is disposed at the ferrule support groove 4. The UV-curing resin is also applied to boundaries between the side face of the ferrule 17 and the first region 2a of the substrate 2 to form resin members 19b for securing the ferrule.

Thereafter, the UV-curing resin members 19a, 19b are irradiated with ultraviolet rays. The optical fiber 16 is secured by the securing member 18 and the resin members 19a, whereas the ferrule 17 is secured by the resin members 19b. Thus, an optical module principal portion 1 is completed.

Since the UV-curing resin is employed for securing the ferrule 17 to the substrate 2, the handling of the optical module principal portion 1 becomes easier after this step. A thermosetting resin can be also used in place of the UV-curing resin.

FIG. 5B is a sectional view showing the optical fiber 16 secured to the optical fiber support groove 5. The optical fiber 16 comes into contact with the two side faces 5a, 5b so as to be supported thereby.

FIG. 5C is a sectional view showing the ferrule 17 secured to the ferrule support groove 4. The ferrule 17 comes into contact with the two side faces 4a, 4b so as to be supported thereby.

Figure 6:
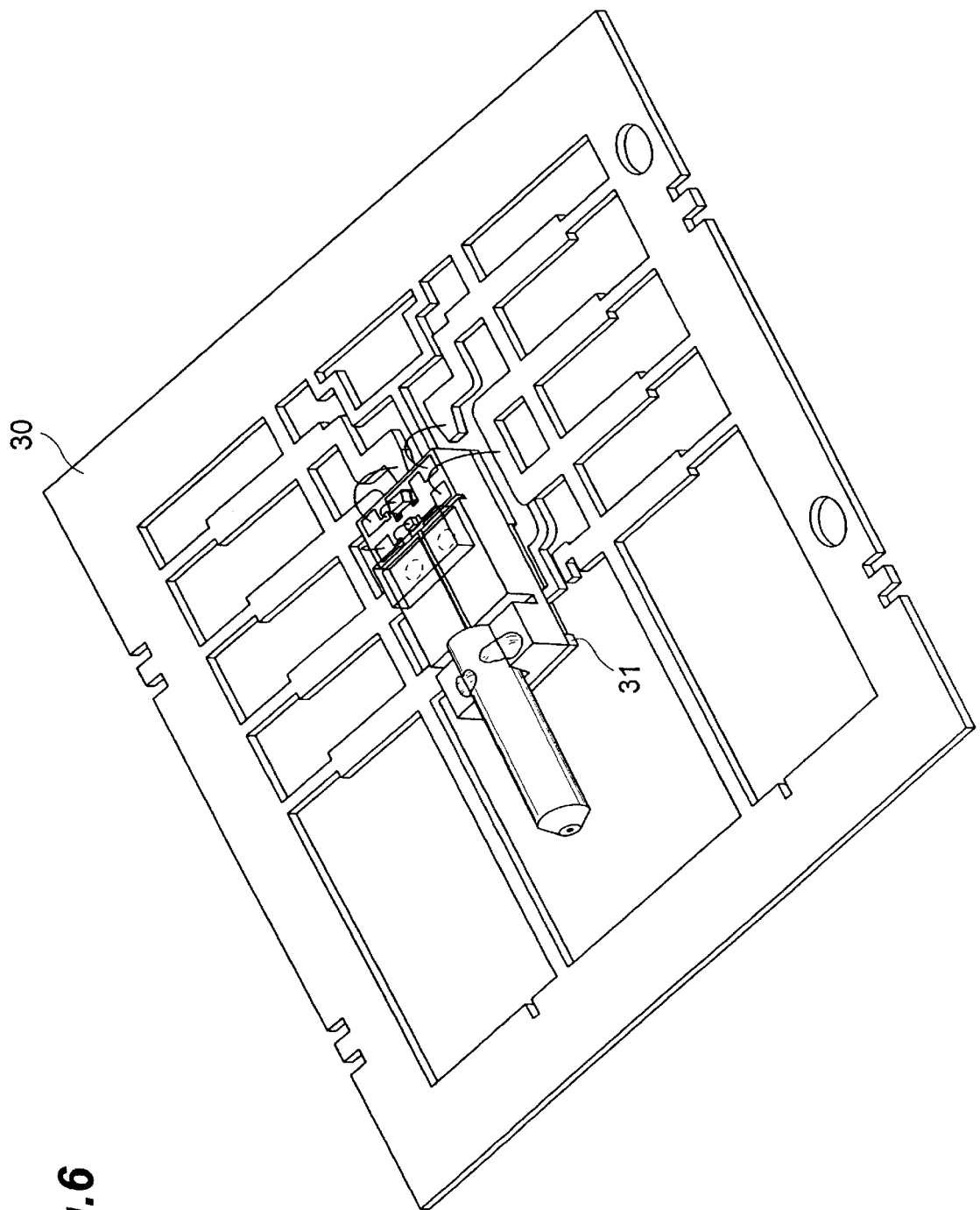
FIG. 6 shows a step of assembling an optical module principal portion onto a lead frame.

FIG. 6 shows a step in which the optical module principal portion 1 is assembled on a lead frame 30. The optical module principal portion 1 is bonded to a die pad 31 of the lead frame 30. After the die pad 31 is coated with silver paste, the optical module principal portion 1 is mounted to the die pad 31. The silver paste is thermally cured by heating under such conditions as 180° C. and 20 minutes, for example. In securing, the lead frame 30 and the ferrule are positioned with respect to each other.

Thereafter, the optical module principal portion 1 and the lead frame 30 are wire-bonded to each other.

Figure 7:
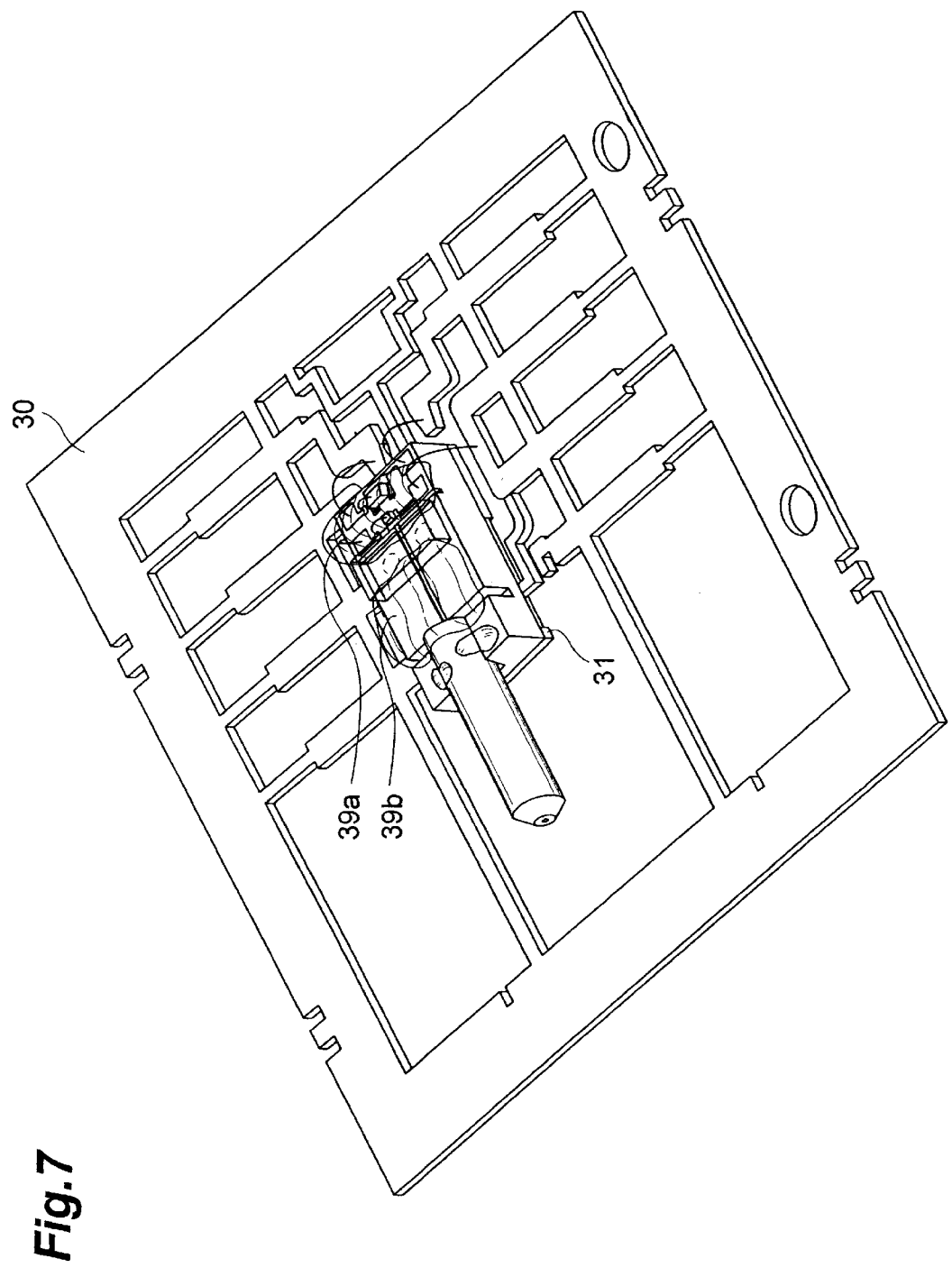
FIG. 7 shows a potting step in which a resin is dropped on the optical module principal portion.

FIG. 7 shows a potting step in which a resin is dropped on the optical module principal portion 1. It is desirable that the potting be carried out on the optical module principal portion at two positions.

One of the two positions lies in a region including the LD 11, the PD 12, and the end portion of the optical fiber 16 optically connected to the LD 11. The potting resin is transparent to the wavelength of light generated by the LD 11. A potting resin body 39a ensures an optical path between the LD 11, and the PD 12 and optical fiber 16.

The other lies in a region covering the optical fiber 16 exposed on the substrate 2. Molding materials used in transfer molding contract upon curing. When the optical fiber is covered with a potting resin body 39b, then it is possible to reduce the influence of the contraction on the optical fiber Any of UV-curing resins and thermosetting resins can be used for forming the potting resin bodies 39a, 39b. They have lower moduli of elasticity and reduce the stress applied to the optical fiber 16 due to the contraction upon curing and due to the thermal expansion or contraction of the resins. It is desirable that the resin be degassed under reduced pressure prior to curing it so as to prevent bubbles from occurring within the resin.

Figure 22:
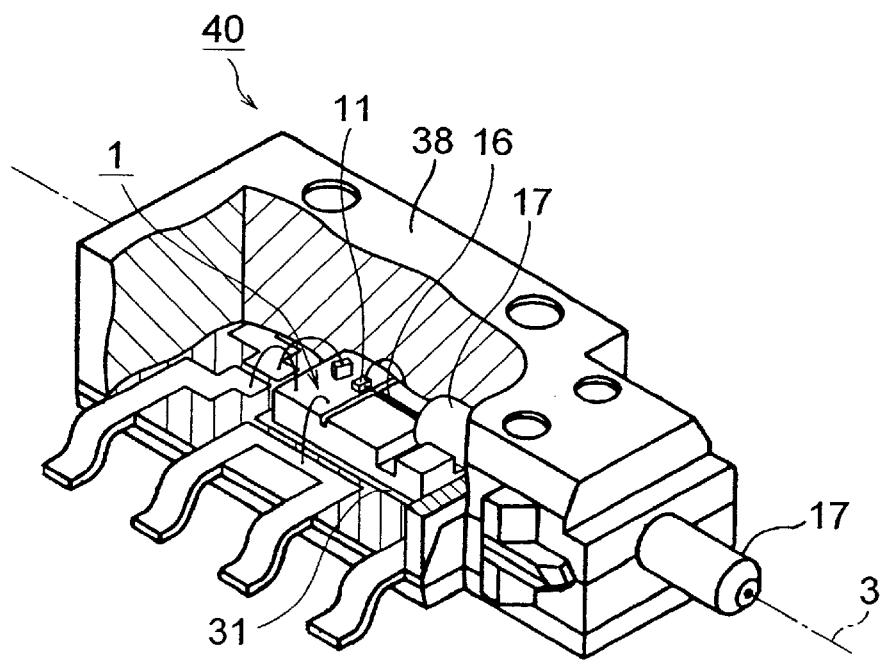
FIG. 22 is a perspective view of the optical module.

Thereafter, the optical module principal portion 1 is encapsulated with a resin body 38 formed by a transfer molding method and then lead forming is carried out, whereby an optical module 40 as shown in FIG. 22 is completed.

In the following, a step in which the carbon-coated optical fiber is provided in the optical module substrate will be explained in detail with reference to FIGS. 8 to 13.

Figure 13:
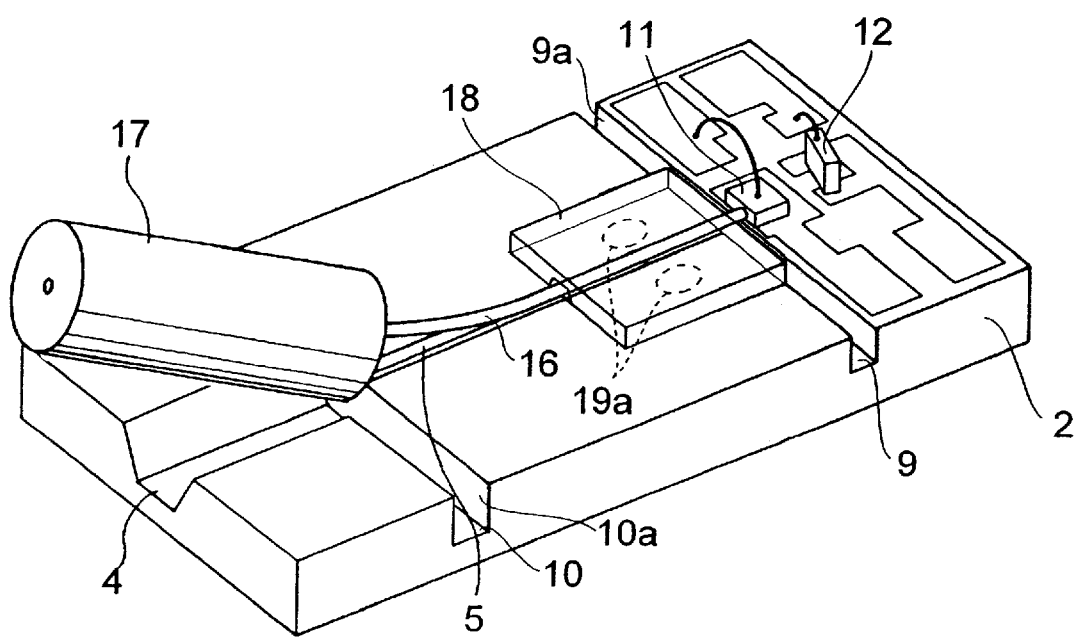
FIG. 13 is a perspective view of FIG. 10.

A procedure in which the optical fiber and the ferrule are disposed in the substrate 2 will now be explained. FIGS. 8 to 11 are side views of the optical module in accordance with an embodiment during assembly, and FIG. 13 is a prospective view of FIG. 10. The following explanation relates to a case where the optical fiber support groove 5 is a V-shaped groove, and the ferrule support groove 4 is a trapezoidal groove.

Figure 8:
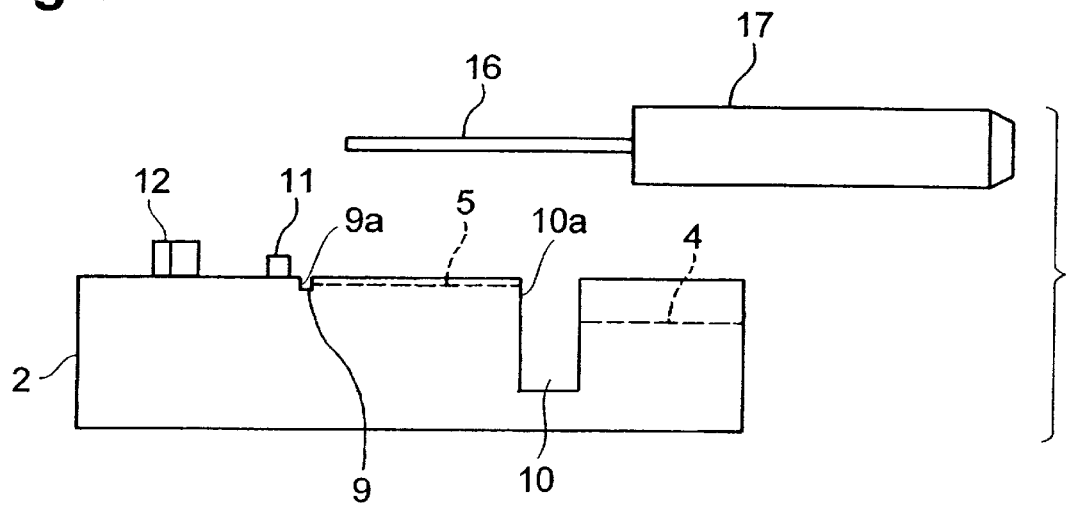
FIG. 8 is a side view of the optical module during assembly.

Referring to FIG. 8, the substrate 2, the carbon-coated optical fiber 16 to be disposed in the optical fiber support groove 5 on the substrate 2, and the ferrule 17 are shown. The optical device 11 is mounted on the device mount portion on the main surface of the substrate 2 so as to face a first end part of the optical fiber support groove 5. Though the optical fiber support groove 5 and the ferrule support groove 4 do not actually appear in side view of FIG. 8, they are indicated by broken lines in FIG. 8.

Figure 9:
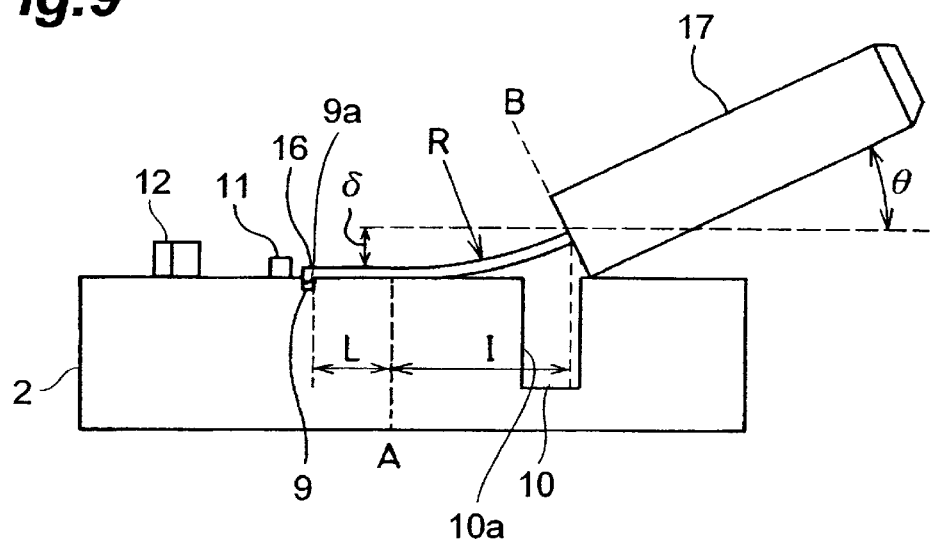
FIG. 9 is a side view of the optical module during assembly.

An end face of the optical fiber 16 is brought into contact with one side face 9a of the positioning groove 9. As a consequence, the end portion of the optical fiber 16 is positioned. The optical fiber 16 is bent such that a tip portion thereof having a length of L is arranged in the optical fiber support groove 5. FIG. 9 shows the optical fiber 16 thus arranged in the optical fiber support groove 5. In this arrangement, the end face of the optical fiber 16 is installed so as to face one end face of the optical device 11. According to FIG. 9, the part of optical fiber 16 having a length of L is arranged in the V-shaped groove 5 without bending. A remaining part of optical fiber 16 is bent at a predetermined curvature R. The optical fiber 16 does not bend within the ferrule 17. As a consequence, these linear parts are tangent to the bent part at the point A (the boundary between the horizontal part of the fiber and the bent part) and the point B (the position of an end face of the ferrule) located at both ends of the bent part of the optical fiber 16, respectively.

Referring to FIG. 9, the point B is positioned at a height δ above the surface of the substrate 2. Let the angle formed between the extension of the center axis of the optical fiber 16 within the ferrule 17 and the surface of the substrate 2 be θ. Let the length of the bent part of the optical fiber 16 as projected onto the surface of the substrate 2 be I.

Figure 14:
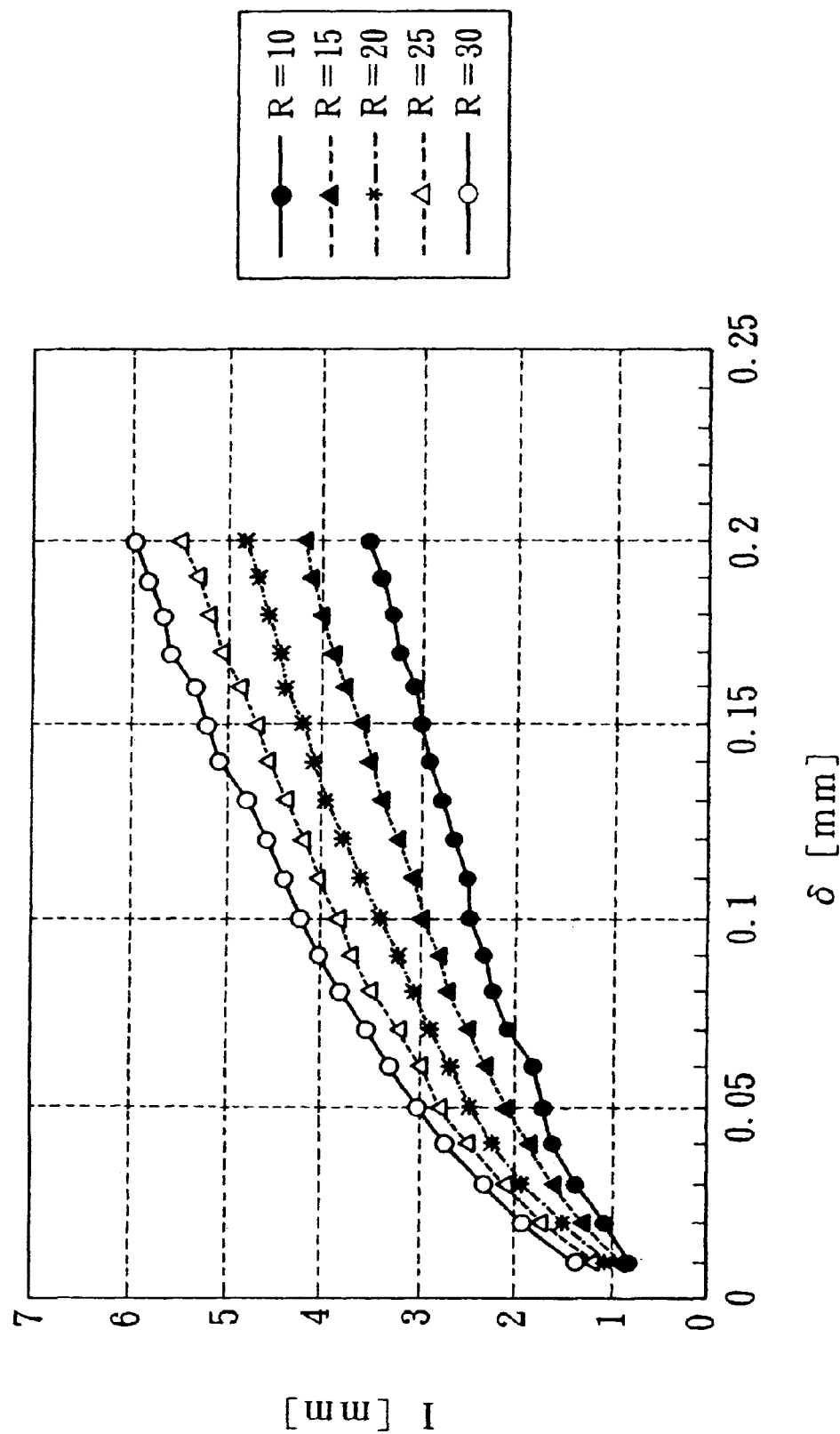
FIG. 14 is a graph showing relationships between I and δ with respect to R.
Figure 15:
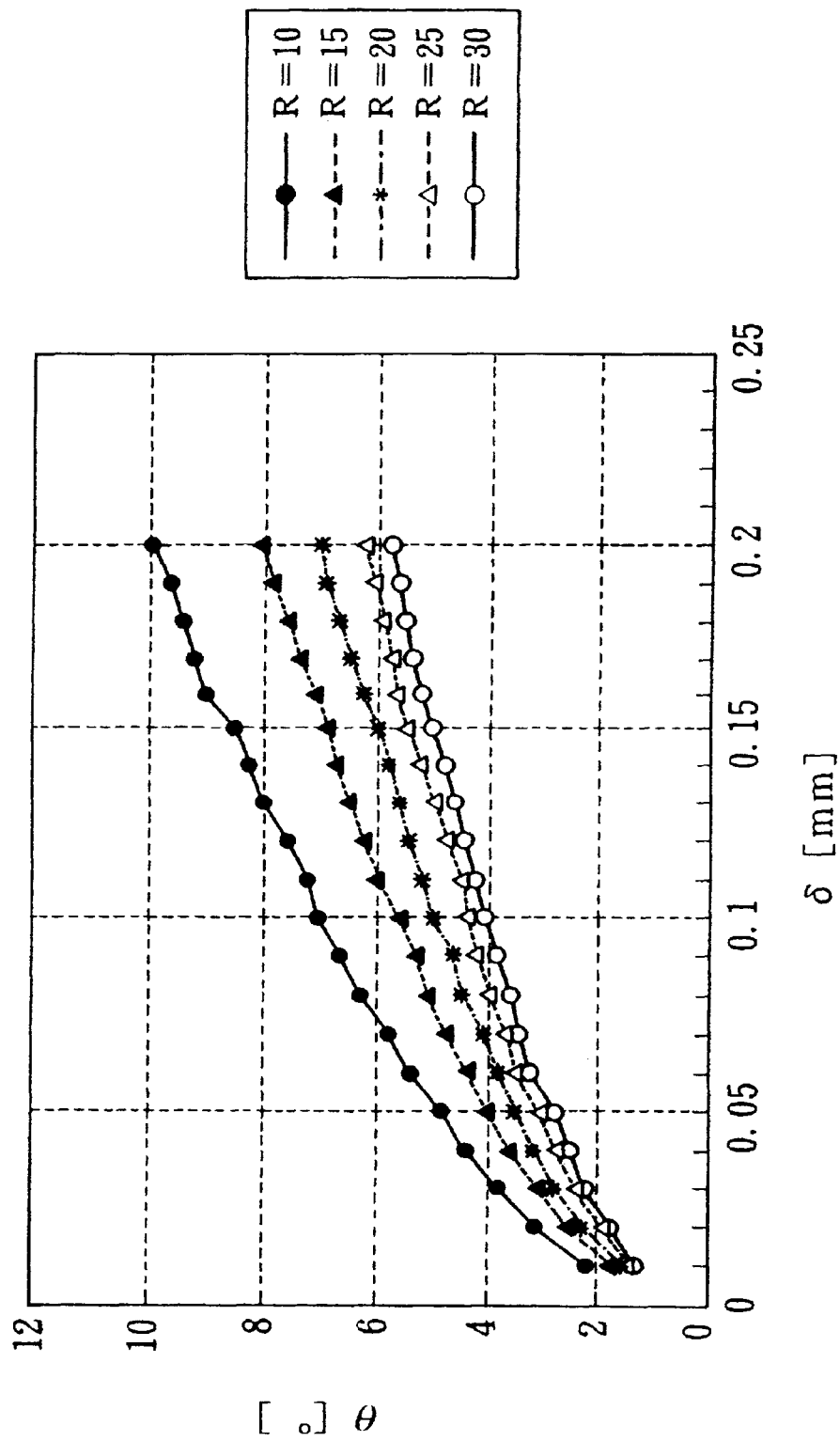
FIG. 15 is a graph showing relationships between δ and θ with respect to R.

As explained above, the optical fiber 16 and the ferrule 17 are arranged such that the tangents at the points A and B coincide with the fiber center axis and ferrule center axis, respectively. In order to attain this arrangement, it is necessary for R, δ, I, and θ to be set properly. Their relationships are approximately represented by:

$$R = (3\delta)/(2\theta^2) \quad (1)$$

$$I = (3\delta)/\theta \quad (2)$$

when θ is very small. FIGS. 14 and 15 show the characteristics represented by equations (1) and (2). FIG. 14 is a graph showing relationships between I and δ with respect to R, whereas FIG. 15 is a graph showing relationships between δ and θ with respect to R. For example, in order to realize a bending of R=10 mm and a height of δ=0.1 mm, the angle θ can be determined with reference to FIG. 15. As a result, it can be seen that θ is required for about 7°. The value of I at this condition can be determined with reference to FIG. 14 and is found to be about 2.5 mm.

When the value of I can be made smaller, then the substrate 2 can be shortened in the groove-extending direction. For example, in the case where the substrate 2 is formed from a silicon wafer, the yield of the substrate 2 would increase.

Lowering R and δ is effective in lowering I. On the other hand, it is preferable for characteristics of the optical fiber 16 that R be kept from too small value. In general, it is desirable that an R of 30 mm or greater be ensured for a normal silica fiber having a cladding diameter of 125 μm. In the carbon-coated optical fiber 16, however, an R is permitted in the order of 10 to 15 μm because the carbon-coated optical fiber 16 exhibits an excellent static fatigue characteristic.

Figure 10:
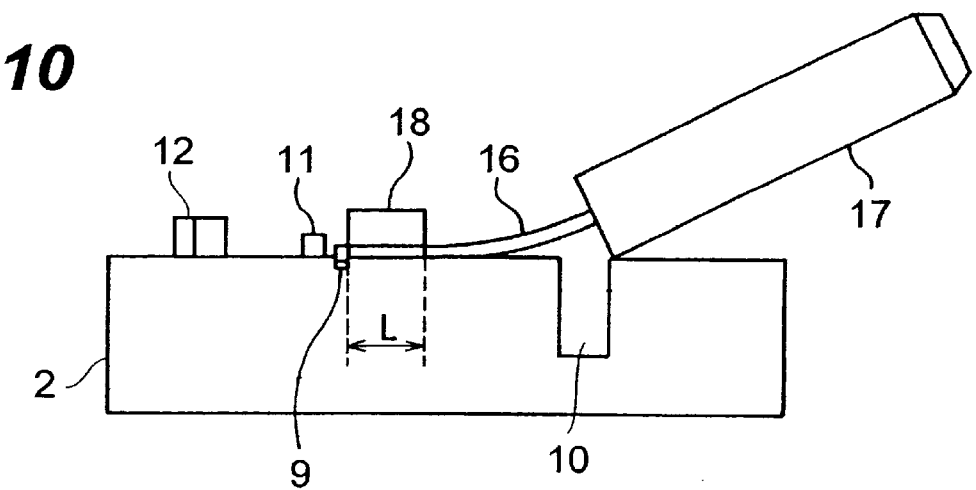
FIG. 10 is a side view of the optical module during assembly.

In the step shown in FIGS. 10 and 13, after the tip portion of the optical fiber 16 is arranged, the optical fiber 16 is secured to the substrate 2 by means of the securing member 18 and the resin members 19a made of the UV-curing resin. Using the UV-curing resin makes it easier to position the optical fiber 16 with respect to the substrate 2 and secure them together in cooperation with the substrate 2 and the securing member 18.

Figure 11:
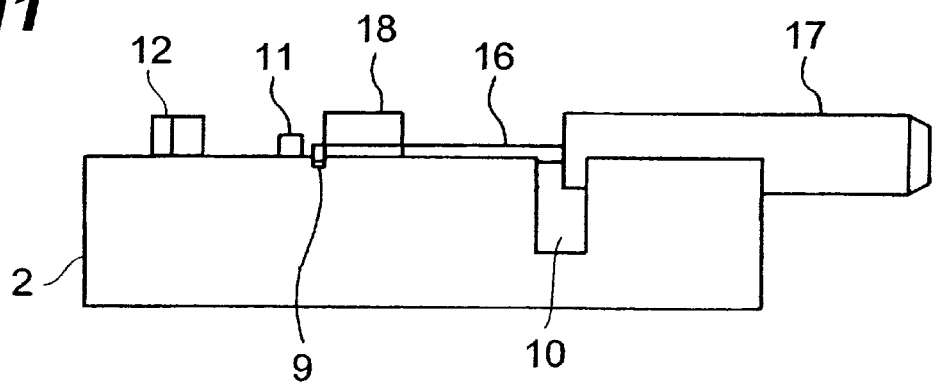
FIG. 11 is a side view of the optical module during assembly.
Figure 12:
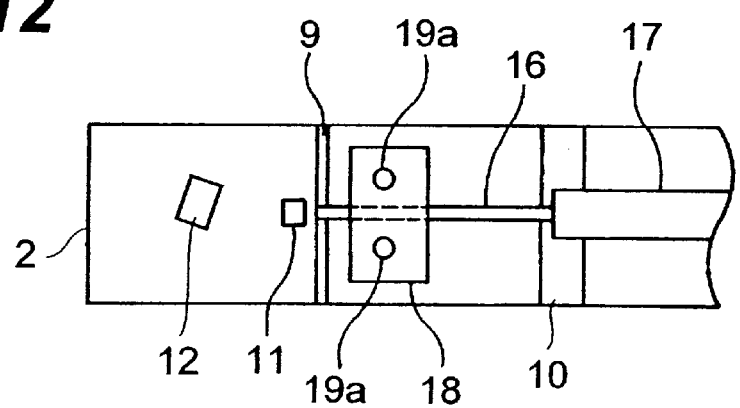
FIG. 12 is a plan view of FIG. 11.

Subsequently, in the step shown in FIGS. 11 and 12, the ferrule 17 with the optical fiber 16 inserted therein is disposed at the ferrule support groove 4.

According to such a method, the optical fiber 16 can be disposed on the substrate 2 having its reduced size in the direction of the optical fiber support groove 5 without bending the carbon-coated optical fiber 16 at a small R.

The subsequent manufacturing steps will not be explained here because they are the same as the steps of making the optical module that have already been done with reference to FIGS. 1 to 7.

Although an optical module principal portion 61 with the optical module substrate having two members consisting of a base and a platform will be explained in the following, the explanation made with reference to FIGS. 1 to 7 is similarly applicable to the optical module principal portion 61 as well.

Figure 16:
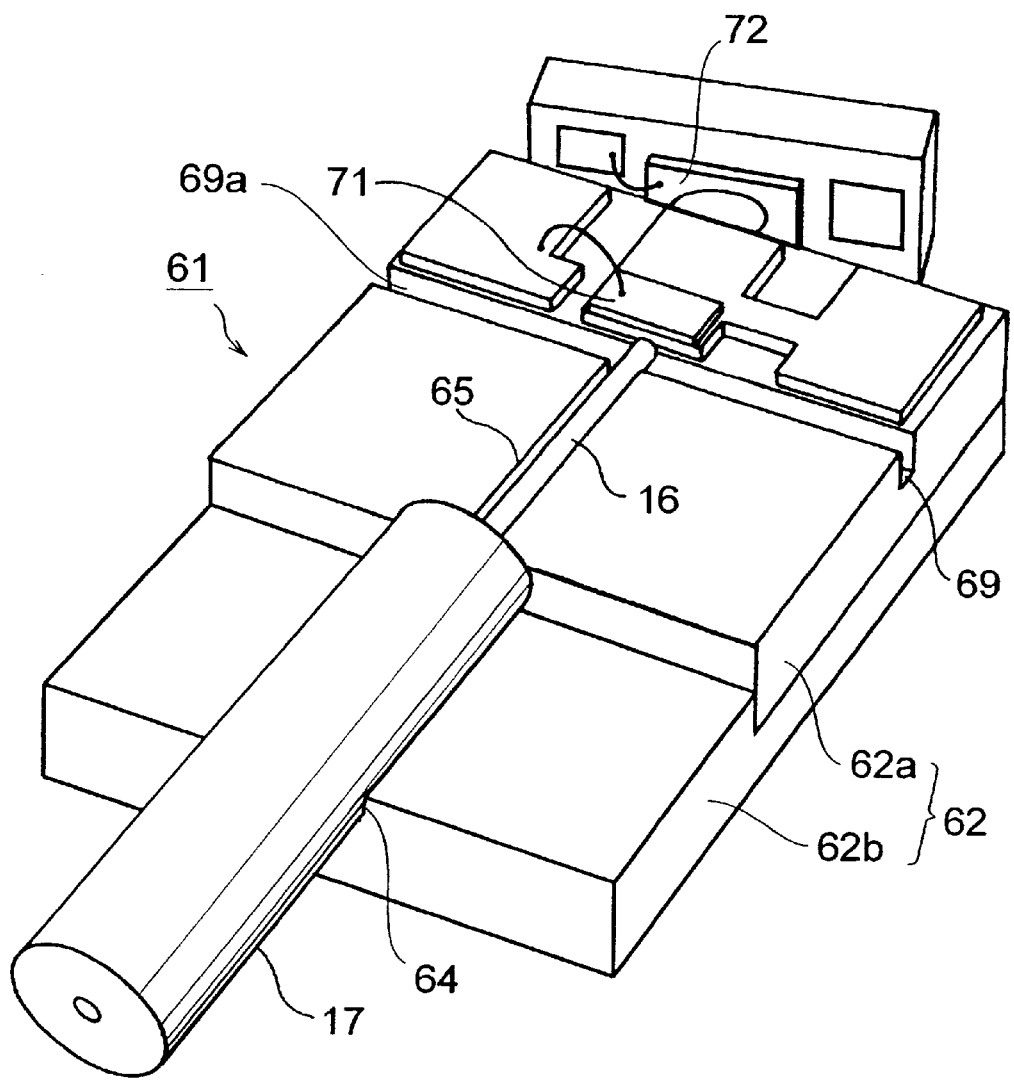
FIG. 16 is a perspective view of the optical module principal portion.
Figure 17:
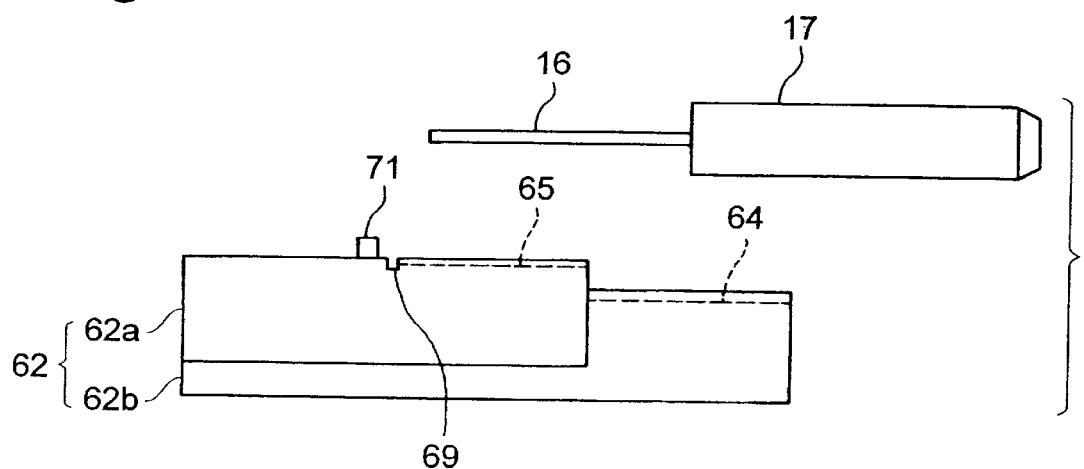
FIG. 17 is a side view of the optical module during assembly.
Figure 18:
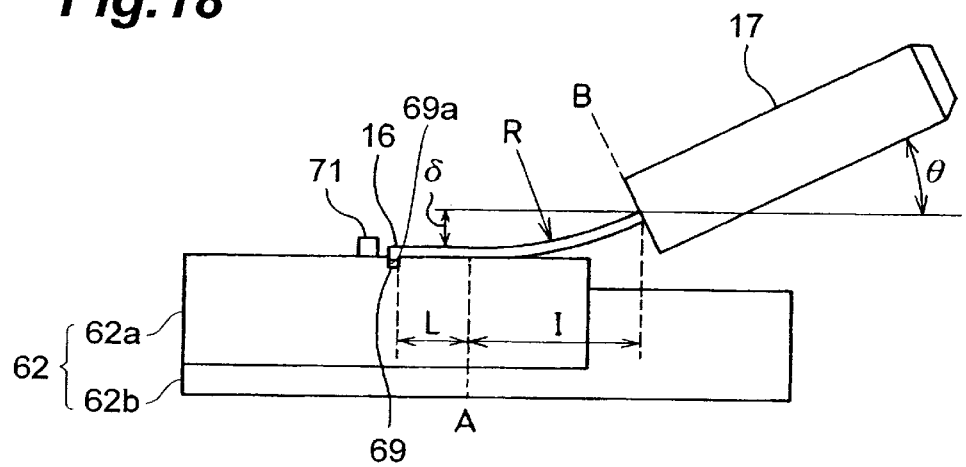
FIG. 18 is a side view of the optical module during assembly.
Figure 19:
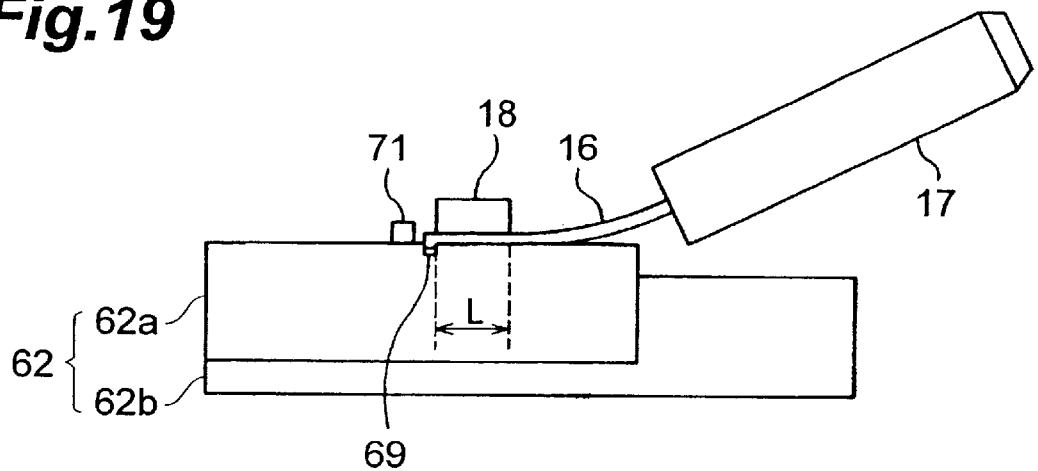
FIG. 19 is; a side view of the optical module during assembly.
Figure 20:
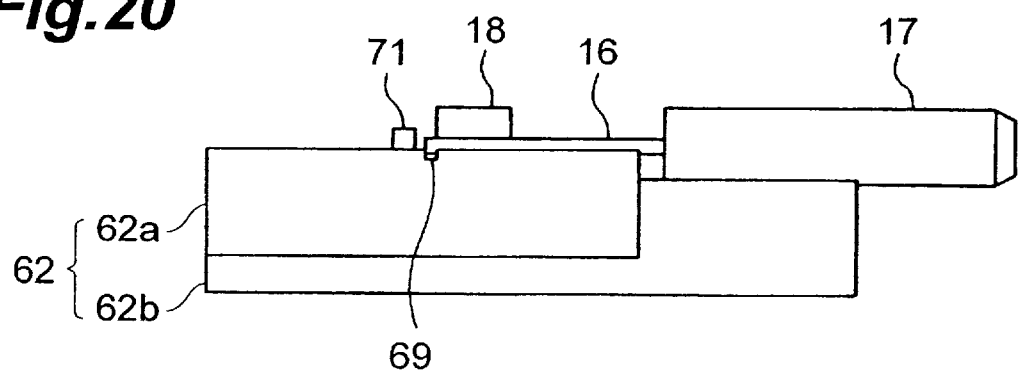
FIG. 20 is a side view of the optical module during assembly.
Figure 21:
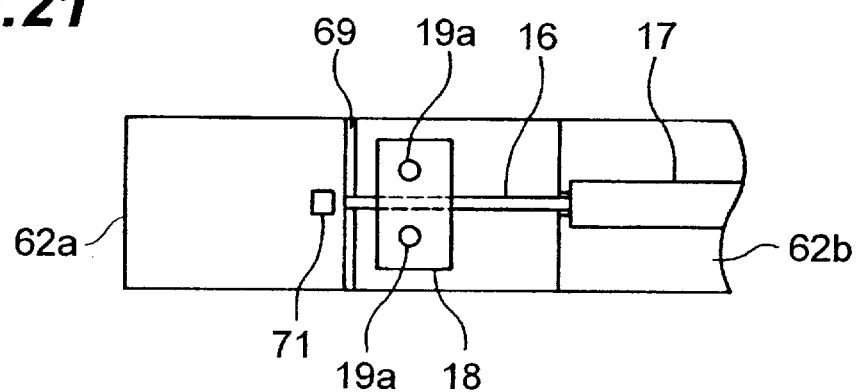
FIG. 21 is a plan view of FIG. 20.

FIG. 16 is a perspective view of the optical module principal portion 61. Referring to FIG. 16, the optical module principal portion 61 comprises a substrate 62, an optical fiber 16, a ferrule 17, an optical device 71, and a light-receiving device 72. The substrate 62 comprises a base 62a and a platform 62b. The base 62b comprises a trapezoidal groove 64, extending in one direction, for mounting the ferrule 17. The platform 62a comprises, on a main surface thereof, a V-shaped groove 65 extending in the same direction as the trapezoidal groove 64, and a positioning groove 69 extending in a direction orthogonal to the V-shaped groove 65. The positioning groove 69 has a side face 69a for defining the position of the optical fiber disposed in the V-shaped groove. This side face 69a corresponds to the side face 9a of the positioning groove 9 in FIG. 2. The platform 62a is mounted on the base 62b. On the platform 62a, the optical device 71 is mounted adjacent to an end portion of the V-shaped groove 65. For example, the platform 62a is formed from a silicon (Si) substrate, whereas the base 62b is made of metal. The base 62b and the platform 62a are also secured such that the center axes of both grooves 64, 65 align with each other. The trapezoidal groove 64 and the V-shaped groove 65 are arranged along the same center axis.

FIGS. 17 to 21 show the method of making an optical module explained with reference to FIGS. 8 to 13 with respect to the substrate 62 shown in FIG. 16. FIGS. 17 to 21 correspond to FIGS. 8 to 12, respectively. In FIGS. 17 to 21, since the substrate 62 constituted by the platform 62a and the base 62b is employed, the ferrule support groove 64 and the optical fiber support groove 65 are formed in their distinct members. The ferrule support groove 4 and optical fiber support groove 5 shown in FIG. 2 correspond to the ferrule support groove 64 and optical fiber support groove 65, respectively. In view of these facts, it is not necessary to mention that the carbon-coated optical fiber 16 and the ferrule 17 can be secured to the V-shaped groove 65 and the trapezoidal groove 64, respectively, in the same procedure as that shown in FIGS. 8 to 13.

As explained in detail with reference to the drawings, the carbon-coated optical fiber is installed at the optical fiber support groove. As a consequence, the carbon-coated optical fiber can be bent with a curvature R smaller than that permitted in a bared optical fiber when being installed at the optical fiber support groove by bending. Therefore, the part of optical fiber extending from the ferrule can be shortened. Since the optical fiber support groove can be also shortened, the optical module substrate can attain a smaller size.

In the method of making an optical module, it is not necessary to pay attention to the handling of the carbon-coated optical fiber as much as has been required for the bared optical fiber in conventional optical modules. The carbon-coated optical fiber also has durability against bending stress. As a consequence, more reliable optical module is provided a s compared with conventionally available module.

Since the carbon coated optical fiber has a strength superior to that of the bared optical fiber, the handling of the optical fiber in inserting it into the ferrule becomes easier than that of bared optical fiber. If the optical fiber is inserted in the ferrule, the part of the optical fiber projected from the ferrule and the optical fiber at the position where the optical fiber projects from the ferrule are excellent in strength.

What is claimed is:

1. An optical module comprising:
    a substrate having first, second, and third regions along a predetermined axis, said substrate being provided with a ferrule support groove in said first region, an optical fiber support groove in said second region, and a device mount portion in said third region;
    a carbon-coated optical fiber secured to said optical fiber support groove;
    a ferrule, secured to said ferrule support groove, covering a side face of said carbon-coated optical fiber; and
    an optical device mounted on said device mount portion so as to be optically coupled with said carbon-coated optical fiber;
    wherein said substrate further comprises a connection groove, having a portion deeper than said ferrule support groove, formed so as to separate said first region and said second region from each other, said connection groove extending in a direction intersecting said predetermined axis.

2. An optical module according to claim 1, wherein said ferrule support groove supports said ferrule by two faces thereof, whereas said optical fiber support groove supports said carbon-coated optical fiber by two faces thereof.

3. An optical module according to claim 1, wherein said device mount portion has a position marker for determining a position at which said optical device is to be mounted.

4. An optical module according to claim 1, wherein said substrate further comprises a positioning groove, having a portion deeper than said optical fiber support groove, formed so as to separate said second region and said third region from each other, said positioning groove extending in a direction intersecting said predetermined axis.

5. An optical module according to claim 1, wherein said substrate is made of silicon.

6. An optical module according to claim 1, wherein said ferrule support groove and said optical fiber support groove are formed on the same surface of said substrate.

7. An optical module comprising:
    a substrate having first, second, and third regions along a predetermined axis, said substrate being provided with a ferrule support groove in said first region, an optical fiber support groove in said second region, and a device mount portion in said third region;
    a carbon-coated fiber secured to said optical fiber support groove;
    a ferrule, secured to said ferrule support groove, covering a side face of said carbon-coated optical fiber; and
    an optical device mounted on said device mount portion so as to be optically coupled with said carbon-coated optical fiber,
    wherein said substrate includes a base having said ferrule support groove, and a platform, mounted on said base, having said optical fiber support groove and said device mount portion.

8. An optical module according to claim 7, wherein said platform is made of silicon, whereas said base is made of metal.

9. A method of making an optical module comprising the steps of:
    preparing a substrate having first, second, and third regions provided along a predetermined axis; said substrate being provided with a ferrule support groove in said first region, an optical fiber support groove in said second region, and a device mount portion in said third region;
    mounting an optical device on said device mount portion of said substrate;
    installing a part of a carbon-coated optical fiber in said optical fiber support groove such that one end face of said optical fiber is optically coupled to said optical device while bending said carbon-coated optical fiber inserted in a ferrule, the part of said carbon-coated optical fiber including an end portion thereof and;
    securing the part of said carbon-coated optical fiber including the end portion thereof installed at said optical fiber support groove to said substrate; and
    installing said ferrule with said carbon-coated optical fiber inserted therein in said ferrule support groove.

10. A method of making an optical module according to claim 9, wherein said step of preparing comprises a step of forming said ferrule support groove in said first region, said optical fiber support groove in said second region, and a marker for aligning said optical device in said third region.

11. A method of making an optical module according to claim 10, wherein said step of forming has a step of simultaneously forming said ferrule support groove and said optical fiber support groove along said predetermined axis, said ferrule support groove supporting said ferrule by two faces thereof, said optical fiber support groove supporting said carbon-coated optical fiber by two faces thereof.

12. A method of making an optical module according to claim 9, wherein said step of preparing has a step of forming a connection groove so as to separate said first region and said second region from each other, said connection groove intersecting said predetermined axis.

13. A method of making an optical module according to claim 9, wherein said step of preparing has a step of forming a positioning groove so as to separate said second region and said third region from each other, said positioning groove intersecting said predetermined axis, said positioning groove having a side face for defining a position of an end portion of said carbon-coated optical fiber.

14. A method of making an optical module according to claim 9, wherein said step of securing has a step of providing a UV-curing resin between said substrate and a securing member which is UV-transparent, and a step of irradiating said UV-curing resin with UV-ray so as to cure said UV-curing resin.

15. A method of making an optical module according to claim 9, wherein said step of securing has a step of providing a thermosetting resin between a securing member and said substrate, and a step of heating said thermosetting resin so as to cure said thermosetting resin.

* * * * *